United States Patent [19]

Bachmann et al.

[11] 3,875,451

[45] Apr. 1, 1975

[54] NEAR-INFRARED LIGHT-EMITTING AND LIGHT-DETECTING INDIUM PHOSPHIDE HOMODIODES INCLUDING CADMIUM TIN PHOSPHIDE THEREIN

[75] Inventors: Klaus Jurgen Bachmann, Piscataway; Ernest Buehler, Chatham; Joseph Leo Shay, Marlboro; Jack Harry Wernick, Madison, all of N.J.

[73] Assignee: Bell Telephone Laboratories, Incorporated, Murray Hills, N.J.

[22] Filed: Dec. 10, 1973

[21] Appl. No.: 423,453

Related U.S. Application Data

[63] Continuation-in-part of Ser. No. 382,021, July 23, 1973, , which is a continuation-in-part of Ser. No. 315,359, Dec. 15, 1972, abandoned.

[52] U.S. Cl. .................... 313/498, 250/370, 357/17, 357/61

[51] Int. Cl. ........................... H01j 1/62, H01j 63/04

[58] Field of Search ................ 313/108 D, 498, 499; 317/235, 48.3, 48.4, 43, 27; 357/17, 61, 63, 64; 250/370

[56] References Cited

UNITED STATES PATENTS

| | | | |
|---|---|---|---|
| 3,617,929 | 11/1971 | Strack | 317/235 |
| 3,633,059 | 1/1972 | Nishizawa et al. | 317/235 |
| 3,668,480 | 6/1972 | Chang et al. | 317/235 |
| 3,690,964 | 9/1972 | Saul | 317/235 |

*Primary Examiner*—Saxfield Chatmon, Jr.
*Attorney, Agent, or Firm*—Wilford L. Wisner

[57] ABSTRACT

There are disclosed indium phosphide p-n junction diodes providing efficient room temperature electroluminescence at wavelengths between 0.98 and 1.10 micrometers and comprising at least an n-type portion containing substantial quantitites of cadmium and tin but forming a minor constituent in the n-type portion. The p-type portion is typically zinc or cadmium doped single crystal indium phosphide used as the substrate in the fabrication process. The n-type portion is epitaxially deposited by liquid phase epitaxial from tin solution. The resulting diode emits efficiently at the 1.05 micrometer wavelength of low loss glass fibers and also provides a better match to the absorption wavelength of infrared-to-visible frequency-converting phosphor than does a gallium arsenide laser or electroluminescence diode. External efficiencies exceeding 1 percent have been obtained.

3 Claims, 9 Drawing Figures

NEAR-INFRARED LIGHT-EMITTING AND LIGHT-DETECTING INDIUM PHOSPHIDE HOMODIODES INCLUDING CADMIUM TIN PHOSPHIDE THEREIN

CROSS REFERENCE TO RELATED APPLICATION

This application is a continuation-in-part of our copending patent application Ser. No. 382,021 filed July 23, 1973, itself a continuation-in-part of our copending patent application Ser. No. 315,359 filed Dec. 15, 1972, now abandoned.

BACKGROUND OF THE INVENTION

This invention relates to electroluminescent diodes of the type known as homodiodes and particularly to those employing principally a III–V semiconductor compound such as indium phosphide.

Until recently there has been only moderate interest in indium phosphide electroluminescent devices, since its bandgap energy is slightly less than that of gallium arsenide, which has been extensively employed for electroluminescence and for laser action. Nevertheless, indium phosphide electroluminescence can provide a better match than can gallium arsenide to the absorption of frequency-converting phosphors, such as $LaF_3$:Yb,En and other rare earth phosphors, i.e., phosphors that absorb in the infrared and emit in the visible. In addition, it happens that the lowest loss wavelength for the new low-loss fused silica fibers is in a range of wavelengths centered about 1.05 micrometers, and particularly potentially includes some longer wavelengths not readily generated by present injection lasers based on the gallium arsenide or gallium aluminum arsenide technology.

From our prior work with cadmium tin phosphide and indium phosphide heterodiodes, we have been aware that the indium phosphide electroluminescence is potentially well matched to this low loss "window" of fused silica fibers, although in the heterodiodes the emission is predominantly from the cadmium tin phosphide. The bandgap energy of indium phosphide is higher than that of cadmium tin phosphide. Our discoveries relating to the cadmium tin phosphide-indium phosphide heterodiodes are disclosed for example in our copending parent application Ser. No. 382,021 filed July 23, 1973 and assigned to the assignee hereof, itself a continuation-in-part of our copending patent application Ser. No. 315,359, filed Dec. 15, 1972 and assigned to the assignee hereof.

While the graded junctions obtained in the heterodiodes offer fascinating properties and possibilities for development, it is desirable to provide the emission in a material having a higher energy bandgap than that of $CdSnP_2$ and under conditions in which the material properties can be better controlled than in the heterodiode.

SUMMARY OF THE INVENTION

According to our invention we have achieved the foregoing objectives by efficient electroluminescence from an indium phosphide homodiode including both p-type and n-type portions forming a junction, by heavily compensating the n-type portion with both cadmium and tin short of the proportions which would make the n-type portion predominantly a cadmium tin phosphide region. Thus, a diode remains an indium phosphide diode; but never before in any III–V semiconductor diode has any region been so heavily compensated, nor has any prior III–V semiconductive light-emitting diode been heavily compensated with the constituents which would provide a II–IV–V semiconductor region.

Advantageously, the new diode provides external quantum efficiencies exceeding 1 percent as empirically determined; and with different degrees of compensation with cadmium and tin, such diodes provide wavelengths anywhere between about 0.98 and 1.10 micrometers.

The p-type region of the indium phosphide diode is conventionally doped with cadmium or zinc and serves as the substrate for epitaxial growth of the heavily compensated region by liquid-phase epitaxy.

BRIEF DESCRIPTION OF THE DRAWING

Further features and advantages of our invention will become apparent from the following detailed description, taken together with the drawing, in which.

DESCRIPTION OF THE ILLUSTRATIVE EMBODIMENTS

Figure 1:
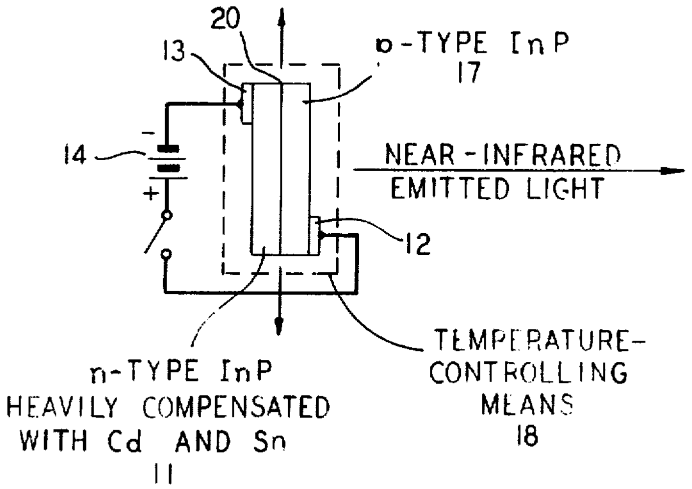
FIG. 1 is a partially pictorial and partially block diagrammatic illustration of a preferred light-emitting diode according to the invention.

In the embodiment of FIG. 1 it is desired to generate the emission of light via electroluminescence, typically in the infrared region of the spectrum, from an indium phosphide (InP) diode. The diode includes p-type indium phosphide crystal 17 which is typically doped with cadmium or zinc, and typically has a higher bandgap energy than the adjacent n-type indium phosphide epitaxial layer 11, for reasons that will now be explained. The n-type layer 11 is typically an epitaxial layer grown upon the crystal 17 so as to be single crystal therewith and so as to form a junction 20 therewith at the major surface of the crystal 17. Typically, the electroluminescence of the diode will be generated near one side of this junction if the majority carriers are injected into the active layer from the other side of the junction. Contact is made to the diode via the contacts 12 and 13 contacting the crystal 17 and layer 11, respectively. The junction is forward-biased for light emission by connecting a source of direct current voltage 14 between contacts 12 and 13 with positive polarities toward contact 12 and the p-type region. A suitable switch may be included in the biasing circuit as shown; and the diode may be contained in a temperature controlling means such as a small refrigeration element or liquid nitrogen dewar, both generally classifiable as a temperature-controlling means 18.

We have observed efficient room temperature electroluminescence from a diode such as that shown in FIG. 1 at wavelengths near the 1.05 micrometer window of low loss glass fibers. External efficiency of about 1 percent or more and peak wavelengths variable between 0.98 and 1.10 micrometers have been obtained.

We believe that the key to this efficient emission is the fact that the n-type indium phosphide layer 11 is heavily compensated by doping with both cadmium and tin, the tin providing the n-type carriers or electrons, even though some of the tin is present as an acceptor providing p-type carriers. Although the room temperature bandgap energy of the indium phosphide is 1.34 electron volts (equivalent to a wavelength of 0.925 micrometers), the heavy compensation of layer 11 is capable of shifting the wavelength of peak emission intensity even to 1.10 micrometers. Obviously, variation of the degree of compensation and variation of the proportions of the opposite type doping levels of layer 11 can provide any wavelength between approximately the bandgap wavelength and 1.10 micrometers.

The overall dimensions of the diode are approximately 1 millimeter along the narrow dimension of the junction, times 0.55 to 0.75 millimeters in the direction of light emission normal to the junction, times approximately 1 to 2 millimeters along the long dimension of the junction. These dimensions are determined largely by the dimensions of the initial substrate crystal 17 which is cleaved on at least four surfaces to minimize surface conduction effects. A typical thickness of the epitaxial layer 11 alone was about 0.15 to about 0.25 millimeters.

The electroluminescent diode of FIG. 1 was prepared by epitaxially depositing the n-type indium phosphide layer 11 by liquid phase epitaxy from tin solution onto the p-type zinc or cadmium doped indium phosphide crystal 17. The growth procedures are essentially the same as described in our above-cited copending patent application, Ser. No. 382,021, for the growth of cadmium tin phosphide from tin solution, except for the relative amount of indium phosphide and cadmium tin phosphide in the tin solution.

Figure 2:
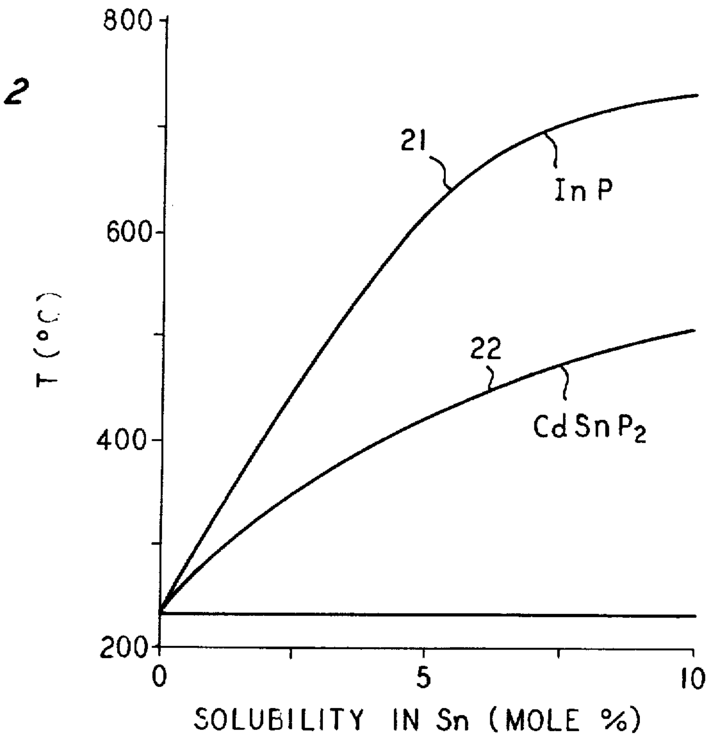
FIG. 2 shows curves of temperature versus relative solubilities in mole percentage for indium phosphide and cadmium tin phosphide.

As shown in FIG. 2, there is an appreciable solubility of indium phosphide in tin for temperatures in the vicinity of 500° to 600° Centigrade. The temperature in degrees Centigrade is shown along the ordinate or vertical axis and the mole percentage solubility in tin is shown along the abscissa or horizontal axis. Curve 21 shows the applicable characteristic for indium phosphide. It will be noted that this solubility at any particular temperature is less than but a substantial fraction of the solubility of cadmium tin phosphide in tin at like temperature, as shown by curve 22.

In a typical example of the device fabrication, a presaturated melt consisting of 2.9 percent indium phosphide, 0.1 percent cadmium tin phosphide, 95 percent tin and 2 percent phosphorous is heated to 525° Centigrade and held there for 15 minutes. The furnace is then cooled rapidly to 510° Centigrade and then tipped to bring the solution into contact with the substrate. Epitaxial growth is then induced by cooling the furnace at a rate of about 4° Centigrade per hour to about 15° Centigrade per hour. Optionally, to insure the maintenance of a continuously flowing fully saturated solution above the substrate during tipping, by the techniques shown in our above-cited patent application, Ser. No. 382,021, may be used; but that technique is not essential here.

Hall measurements on an indium phosphide layer 11 from which the substrate 17 had been removed by polishing indicate an electron concentration of $5 \times 10^{19}$ $cm^{-3}$ and a mobility of 230 $cm^2$/volt seconds. Apparently, substantial quantities of tin were incorporated into the epitaxial layer 11 during the growth of the diodes we have tested. X-ray fluoresence measurements on the above-mentioned Hall sample evidenced the presence of tin at a level of about 0.2 percent. We believe that the tin level should in all cases be greater than about 0.15 mole percent to obtain comparable results. Due to the limitations of the absolute accuracy of the X-ray analysis, we can only say that most of the tin is incorporated as electrically-active donors. For this control experiment, no cadmium tin phosphide was added to the tin solution.

Measurements on these electroluminescent diodes indicated one-sided abrupt junctions, since $C^{-2}$ was linear in voltage for reverse voltages as large as 10 volts. The slopes indicated impurity concentrations in the range $10^{16}$ to $10^{17}$ per cubic centimeter, which is characteristic of the p-type substrate 17. The electrical properties of diodes grown on these relatively pure substrates were excellent. Rectification ratios at 1 volt bias were typically $10^7$:1. In the forward direction the current was limited by a series resistance of about 10 to 100 ohms due to the relatively pure p-type substrates. Of course, this resistance can be greatly reduced in several ways such as polishing the substrate below its present thickness of about 0.5 millimeters or by first growing a relatively pure p-type layer from indium-tin solutions onto a low resistivity p-type substrate crystal 17. Diodes grown on more heavily doped substrates ($N_A - N_D$ greater than or equal to $10^{18}$ per cubic centimeter) displayed excess forward and reverse currents which we attribute to non-radiative tunneling currents.

Figure 3:
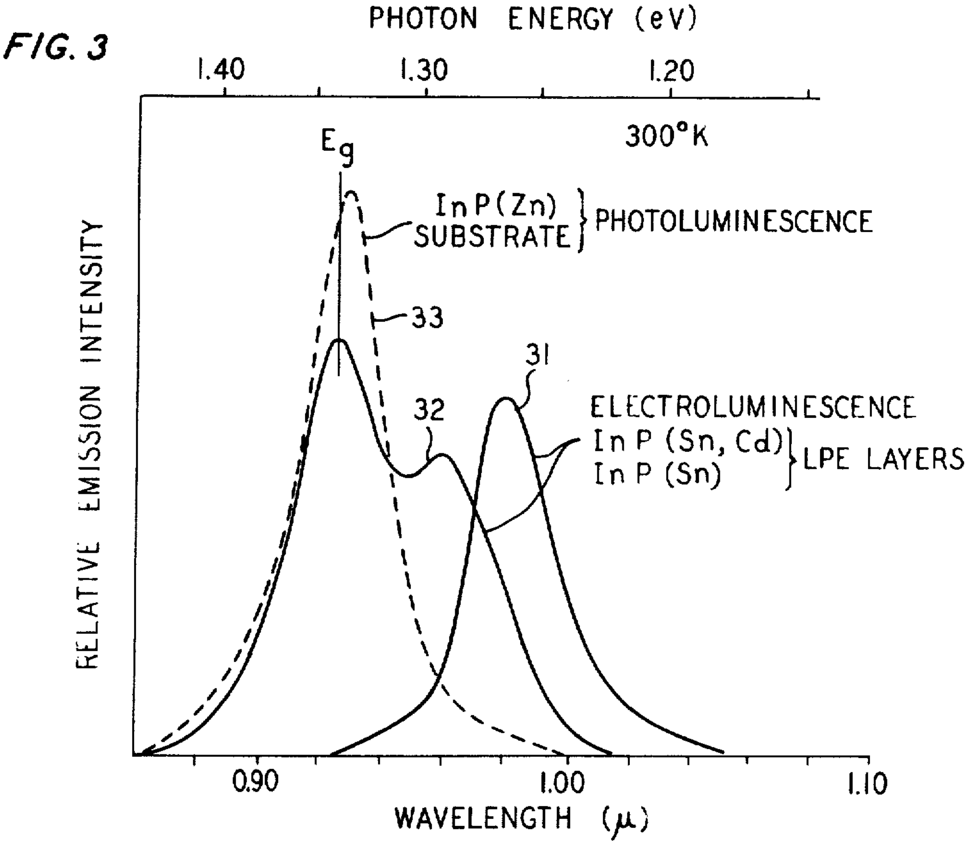
FIG. 3 shows relative emission intensities of electroluminescence for the different regions of various diodes according to the invention.

In FIG. 3 we compare the electroluminescence spectrum of indium phosphide light emitting diodes grown from tin solution with (curve 31) and without (curve 32) any cadmium dopant and the photoluminescence spectrum of the lightly zinc-doped substrate 17 (dotted curve 33). The relative emission intensity, unitless, is plotted along the ordinate or vertical axis; and the wavelength in micrometers is plotted along the abscissa or horizontal axis. It can be seen that appreciable amounts of both electroluminescence spectra are at longer wavelengths than the photoluminescence spectrum which is centered on the energy gap of indium phosphide at 0.925 micrometers. We attribute the relatively long wavelength emission of the light-emitting diodes to the tin-doped epitaxial layer for both of the cases illustrated by curves 31 and 32. For otherwise identical growth conditions, the addition of cadmium tin phosphide to the tin solution shifts the emission to longer wavelengths. The internal quantum efficiencies of both light-emitting diodes were about one percent at room temperature. Since the doping levels of the substrates were typically three orders of magnitude less than the tin doping of the epitaxial layers, it is clear that the quantum efficiency greatly exceeds the expected injection of minority carriers (holes) into the epitaxial layer, for that injection efficiency would be of the order of $10^{-3}$. It is likely that the heavy concentrations of both cadmium and tin in the epitaxial layer 11 effectively reduce the energy gap. It is likely that the efficient injection of minority carriers into the layer as evidenced by the efficient electroluminescence at long wavelengths is achieved because the heavy concentrations of cadmium and tin in the layer 11 effectively reduce its energy gap relative to the substrate crystal 17.

Figure 5:
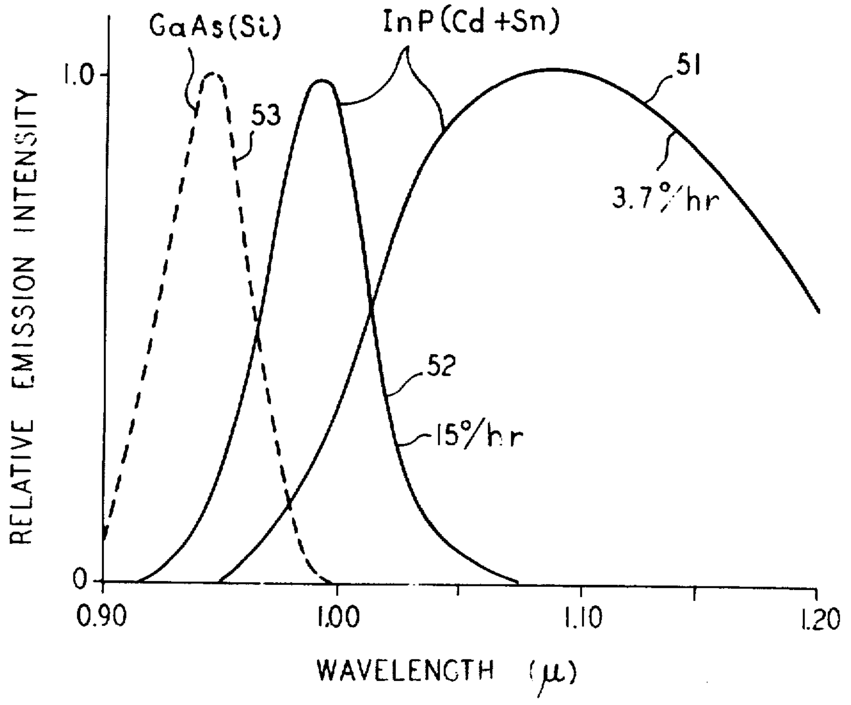
FIG. 5 shows curves characterizing the emissions of two forms of diodes according to the present invention and a gallium arsenide electroluminescence diode.

We have found that the electroluminescence spectrum of our new diode can be varied considerably by varying the growth conditions. In FIG. 5 we compare the electroluminescence spectra of two indium phosphide diodes grown according to our invention and under identical conditions except for the cooling rates, which were 3.7° per hour for curve 51 and 15° per hour for curve 52. The total external efficiencies for these planar devices were 0.1 and 1 percent, respectively, corresponding to internal efficiencies of about 1 percent and about 10 percent, respectively. It will be seen that the slower cooling rate or growth rate shifts the electroluminescent emission to longer wavelengths, broadens it in wavelength, and makes it more efficient. The slowest cooling rate could be as low as about 0.1° C. per hour. Depending upon the desired application of the device, there can be some trade-off or compromise among these properties to obtain the optimum growth rate.

While we do not wish to have our invention limited by the following tentative theoretical considerations, we offer the following explanation as one which may contribute to some insight into the potentialities of this invention and its incipient effect upon the art. Just as the efficient emission of a gallium arsenide diode doped with silicon results from the heavy compensation of one or more regions thereof by the amphoteric dopant silicon, we believe that the efficient emission we have observed in our new indium phosphide diode results from a heavy compensation by tin (mostly donors, some acceptors) and cadmium (acceptors). The incorporation of these centers depends upon the growth conditions. For the purpose of comparison the relative emission intensity and spectrum of the silicon doped gallium arsenide device just mentioned is shown by the dotted curve 53.

Figure 4:
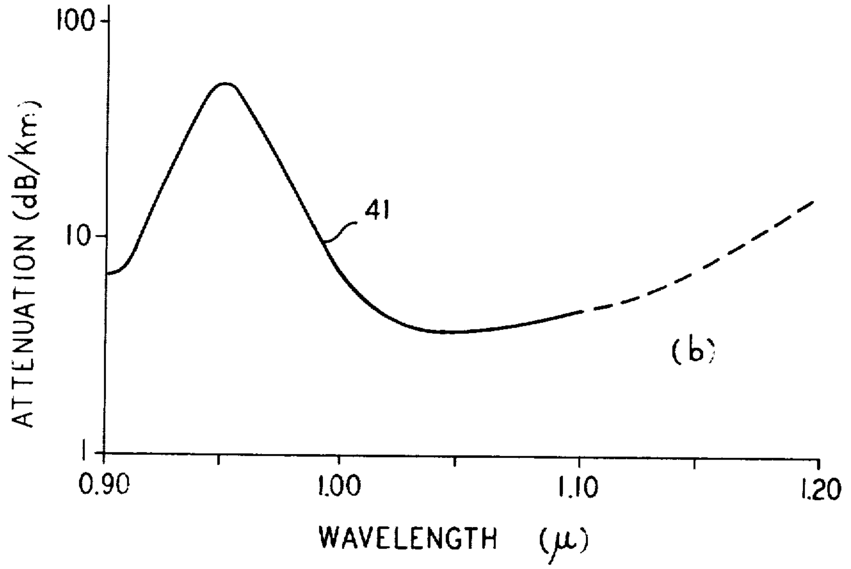
FIG. 4 shows the absorption curve depicting attenuation versus wavelength for a low loss fused silica glass fiber.

To appreciate the potential impact of the light-emitting diode of FIG. 1 upon the optical communication art, we show in FIG. 4 by means of curve 41 the absorption spectrum of a recently reported low-loss glass fiber of fused silica. Attenuation in dB/km is shown along the ordinate or vertical axis on a logarithmic scale and wavelength is shown along the abscissa or horizontal axis on a linear scale. It is apparent that the emission spectrum of the indium phosphide light emitting diode of FIG. 1 (see curve 51, in FIG. 5 below curve 41 of FIG. 4) lies in the vicinity of the 1.05 micrometers low loss window of the fiber, the properties of which are represented by curve 41. We suggest, therefore, that such indium phosphide diodes should be considered as strong candidates for use as sources with long-haul optical communication systems.

The growth conditions in detail differ from those described in our above-cited copending application, Ser. No. 382,021, primarily only in the proportion of cadmium used in the solution for liquid phase epitaxy. Typically, the percentage of cadmium is only 0.1 mole percent.

The substrate InP crystals were prepared via liquid encapsulated Czochralski pulling using $B_2O_3$ as encapsulant and 50 atmospheres pressure of nitrogen to close off the melt.

The crystals were free of indium inclusions and growth twins. The dislocation density varies between $10^3$ and $10^5$ cm$^{-2}$. The density of holes should be $\leq 5 \times 10^{17}$ cm$^{-3}$. Such a substrate crystal of indium phosphide is now placed in the improved tipping apparatus of FIGS. 7A and 7B for implementation of our improved epitaxial growth process.

Figure 7A:
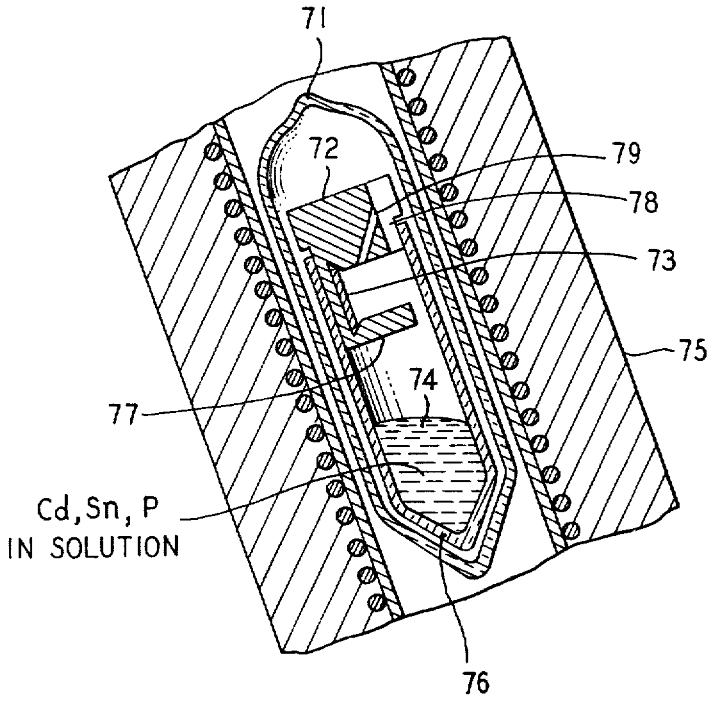
FIGS. 7A and 7B show the epitaxial growth apparatus at two different stages of the process of making our diodes.
Figure 7B:
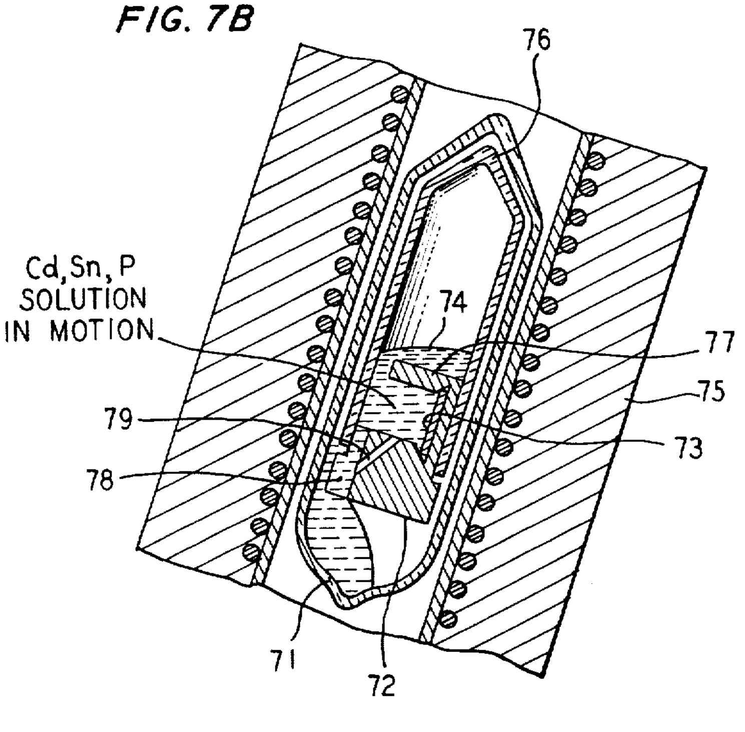

In FIGS. 7A and 7B the indium phosphide substrate is labeled 73. It is placed into a lateral dovetail slit in plug 72 which is inserted in the top of vitreous carbon crucible 76. It is baffled from the vapor of the solution 74 contained in crucible 76 by the baffle 77 which is an extension of the plug 72.

The furnace 75, tipping ampoule 71 and crucible 76 are shown in FIG. 7A in the position desired prior to tipping.

According to our modified procedure, the solution 74 is presaturated prior to placement in crucible 76 so that its homogenization within crucible 76 just prior to tipping can be accomplished by equilibrating at 525° Centigrade for about 15 minutes, rather than at 610° Centigrade for about 60 minutes. This lower temperature and relatively short heating time is made possible by the following premelting procedure.

1. Solutions of the various compositions listed in table 1 are made by heating the appropriate mixture of the elements (6N purity for Cd, Sn, In and P) in vitreous carbon crucibles similar to crucible 76 in FIG. 7A, sealed within evacuated quartz ampoules similar to ampoule 71, for 1 hour to 600° Centigrade. In some cases $CdSnP_2$ crystals were used to make up the solutions instead of a mixture of Cd, Sn and P.

2. The ampoules containing the solutions are water quenched from 600° Centigrade to room temperature resulting in an intimate mixture of small crystals of $CdSnP_2$, $Sn_4P_3$ and InP embedded in Sn.

3. These preconditioned mixtures were loaded into the crucible 76 (FIG. 7A and 7B) and used for the actual liquid-phase epitaxy (LPE) run.

The Inp substrates are prepared by cutting a p-type indium phosphide boule into 0.020 inch thick wafers, each with the [100] axis perpendicular to the largest face. The substrate wafers are lapped on 600 grit abrasive paper to remove at least 0.001 inch of InP, followed by Syton polishing for one hour to remove at least another 0.001 inch of material. Syton is a trade name for a chemically active fine abrasive solution. After polishing, the substrates are washed in boiling trichloroethylene to remove residuals of the wax mounting, and dried in clean air. Typically, substrates of 0.2Ω-cm resistivity and carrier concentration $N_A - N_D \sim 10^{16}$/cc are used in our new experiments, whereas the substrates discussed in our above-cited copending patent application were 0.07 – 0.025 Ω-cm with 1-5 $\times$ 10$^{18}$ free holes/cc. Most of the LPE layers were deposited onto (100) substrate surfaces. However, it was found that epitaxial layers can as well be grown on other orientations as, for example, the (111) and (110) surfaces and on vicinal faces slightly off the low index orientations. After the above-described preparation and cleaning procedure, the InP substrate wafer 73 is placed into plug 72 FIG. 7A.

Figure 8:
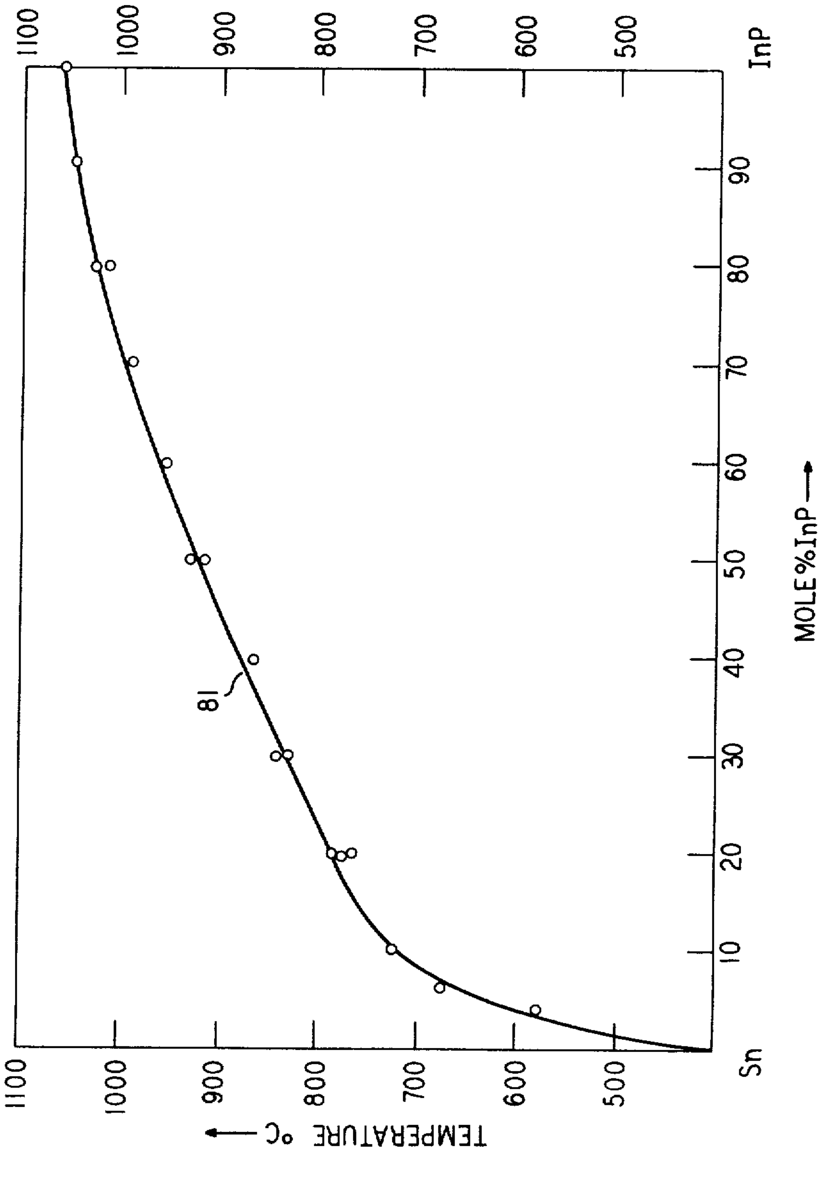
FIG. 8 shows a curve called a liquidus line, which is helpful in explaining the growth process.

The crucible 76, thus loaded with the premelted solution 74 and substrate 73 mounted in plug 72, is loaded into the fused silica tipping ampoule 71 which is then evacuated, backfilled with He to 0.87 atmospheres at room temperature and sealed. It will be noted that the substrate is now held on a lateral wall of the plug and that the baffle 77 minimizes vapor depositions on the exposed surface of substrate 73 prior to the desired depositions during tipping. It will also be noted that the two drain holes 78 and 79 will allow the interior of the crucible 76 to communicate with the unoccupied interior portion of tipping ampoule 71 during the tipping step shown in FIG. 7B thereby providing smooth, continuous flow of saturated solution past the exposed surface of substrate 73. As mentioned above, the complete assembly, including the substrate, is heated to 526° Centigrade rather than to 610° Centigrade (this heating takes about 60 minutes) and held for 15 minutes at this temperature, then lowered quickly to 510° Centigrade and held at this temperature for 15 minutes. Then the assembly is tipped so as to obtain epitaxial growth. Immediately after tipping, the melt and InP are cooled at a rate of 0.147 mV/hour measured with a *Pt*/*Pt* – 10%Rh thermocouple over a period of 24 hours. This is equivalent to a cooling rate of 15° Centigrade/hour during the first hour and 19° Centigrade/hour during the 24th hour. After 24 hours, the ampoule is at 120° Centigrade. Finally, the assembly is removed from the furnace and air cooled. The substrate is separated from the ingot by the procedure described in both of our above-cited copending applications. The above-described temperature vs. time program for LPE growth is a typical example which results in high quality epitaxial layers for all the different solution compositions listed in table 1. Although, most of our experiments have been performed with the Sn-rich solutions of table 1, solutions richer in InP can be used. This conclusion is based on data which are represented by curve 81 of FIG. 8, which is a so-called liquidus line of the system InP-Sn. Variations of the growth procedure are made to optimize the conditions for nucleation and layer growth for each individual solution composition. These variations include changing the tipping temperature within the limits indicated by the pseudo-binary phase diagram Sn-InP FIG. 8, and changing the initial cooling rate within the limits 20° Centigrade/hour to 0.1° Centigrade/hour. The change in tipping temperature is necessary to match the initial temperature of The substrate after tipping to the nucleation temperature of the epitaxial layer, while variations in cooling rate are made to vary the growth rate of the epitaxial layer. The nucleation temperature as well as the optimum growth rate of the epitaxial layer depend on both solution concentration and crystallographic orientation of the substrate.

The epitaxial growth process specifically comprising the second part of the tipping procedure can be discussed with reference to FIG. 7B with the entire furnace inverted, or just with the tipping ampoule 71 within furnace 75 inverted so that the heated solution 74 runs past the baffle 77 and flows with good mixing past the exposed surface of substrate 73 and drains continuously through both the diagonal drain hole 79 and the drain hole 78, which is parallel to substrate 73, toward the evacuated space of type ampoule 71. The continuous motion of the solutions past the surface of substrate 73 is found to improve the optical quality of the homojunction grown. It is also found that the density of defects in the homojunction interface region is drastically reduced by the flow characteristic promoted by the revised configuration of plug 72 and positioning of substrate 73.

Figure 6:
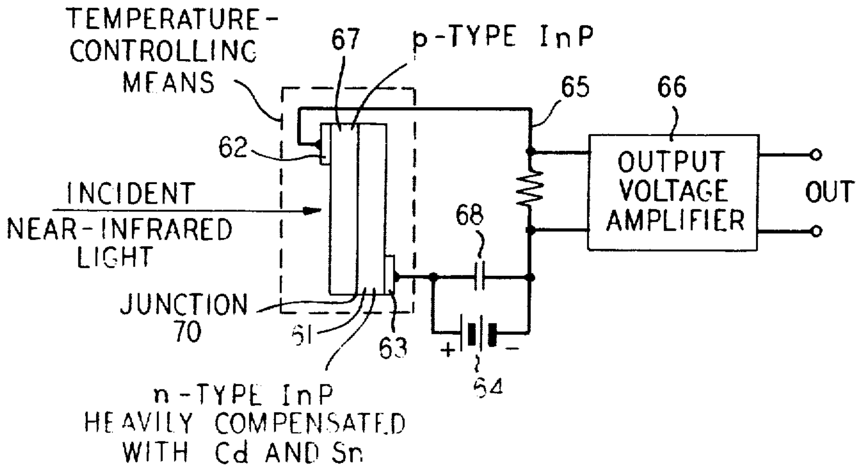
FIG. 6 shows a partially pictorial and partially block diagrammatic illustration of a photodetector diode according to our invention.

In the embodiment of FIG. 6 it is desired to detect information which has been modulated onto a coherent light beam. Illustratively, the light beam is that of a solid-state neodymium ion laser oscillating at 1.06 micrometers; but it could also be a comparable laser in the wavelength range between about 0.925 micrometers and 1.15 micrometers. The modulated beam is incident upon the p-type indium phosphide substrate crystal 67 from the left. The substrate crystal 67 is substantially transparent to the received beam since it has a bandgap about 0.92 micrometers; and substrate 67 is more advantageous as the entrance region than the epitaxial layer 61 since the latter has a lower bandgap which may even be at longer wavelengths than the incoming laser light. A junction 70 is provided at the major surface of crystal 67 upon which the epitaxial n-type layer 61 is grown. The epitaxial layer 61 which is substantially less the epitaxial layer 11 of FIG. 1 absorbs nearly all of the modulated light propagating into it. A photovoltaic response is coupled from the device by electrodes 62 and 63, the former being diffused into substrate 67 with an excess of the acceptor-type impurity of substrate 67 and the latter being soldered into epitaxial layer 61.

The external circuit for the homodiode includes the series combination of sensing resistor 65 and the dc voltage source 64 connected in series circuit with its negative terminal toward contact 62 and its positive terminal toward contact 63. Illustratively, an output voltage amplifier 66 is provided and has its input circuit connected across sensing resistor 65. For biasing a fast photodiode, such as the homodiode of the invention, a substantial storage capacitor 68 is connected across source 64.

The overall dimensions of the heterodiode are approximately one mm along the narrow dimension of the junction, times 0.55 to 0.75 mm in the direction of light passage times approximately one to two mm along the long dimension of the junction. These dimensions are determined largely by the dimensions of the initial substrate crystal 17 which is cleaved on at least four surfaces to minimize surface conduction effects. A typical thickness of the epitaxial InP layer alone was about 0.01 to 0.15 mm.

The diode of FIG. 6 is grown by identically the same process as the diode of FIG. 1, as described hereinbefore. The heavy compensation of the epitaxial layer 61 with cadmium and tin is advantageous to lowering its effective bandgap in a specific application so that the desired portion or, typically, nearly all of the incident light is absorbed.

What is claimed is:

1. A light-emitting diode of the type comprising a crystalline body of indium phosphide (InP) including both p-type and n-type portions forming a junction and electrode means for electrically coupling to said body, said n-type portion being characterized by quantities of cadmium and tin substantially exceeding impurity doping levels, the tin being present in a quantity exceeding that of the cadmium but most of said cadmium together with an equal quantity of said tin forming a significant minor portion of cadmium tin phosphide ($CdSnP_2$) in said InP.

2. A light-emitting diode of the type claimed in claim 1 in which a part of the tin in the n-type portion of the indium phosphide body is distributed as a donor and a part of the cadmium therein is distributed as an acceptor in an amount nearly equal to the amount of donor tin to compensate the n-type portion of the body to a substantial degree.

3. A light-emitting diode according to claim 2 in which tin is present in the n-type portion of the indium phosphide body at a level of at least 0.15 mole percent.

* * * * *